(12) United States Patent
Radke (10) Patent No.: US 7,139,182 B2
(45) Date of Patent: Nov. 21, 2006

(54) CUTTING CAM PEAK POWER BY CLOCK REGIONING

(75) Inventor: William Radke, San Francisco, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/033,987

(22) Filed: Jan. 13, 2005

(65) Prior Publication Data

US 2005/0169030 A1  Aug. 4, 2005

Related U.S. Application Data

(63) Continuation of application No. 10/765,396, filed on Jan. 28, 2004, now Pat. No. 6,856,529, which is a continuation of application No. 10/655,215, filed on Sep. 5, 2003.

(51) Int. Cl.
*G11C 15/04* (2006.01)
*G11C 5/14* (2006.01)

(52) U.S. Cl. ............. 365/49; 365/230.03; 365/189.07; 365/233; 365/194; 711/108; 370/401

(58) Field of Classification Search .............. 365/49, 365/189.07, 230.03, 233, 194; 713/153, 713/154; 711/108; 370/401
See application file for complete search history.

(56) References Cited

U.S. PATENT DOCUMENTS

| | | | |
|---|---|---|---|
| 6,747,885 B1 | 6/2004 | Park | 365/49 |
| 6,751,111 B1 | 6/2004 | Foss et al. | 365/49 |
| 6,785,153 B1 | 8/2004 | Regev et al. | 365/49 |
| 6,856,529 B1 * | 2/2005 | Radke | 365/49 |
| 6,959,358 B1 * | 10/2005 | Regev et al. | 711/108 |

* cited by examiner

*Primary Examiner*—Andrew Q. Tran
(74) *Attorney, Agent, or Firm*—Dickstein Shapiro LLP (57) ABSTRACT

A CAM device architecture where CAM cells are divided into at least two arrays and each array is operated in a different clock domain so that at no time are the arrays simultaneously drawing maximum power. By dividing the CAM array into a plurality of arrays and staggering the search operation so that every array does not simultaneously draw maximum power, the peak power consumption of the CAM device is reduced.

16 Claims, 8 Drawing Sheets

CUTTING CAM PEAK POWER BY CLOCK REGIONING

This application is a continuation of application Ser. No. 10/765,396, filed Jan. 28, 2004 now U.S. Pat. No. 6,856,529 which is a continuation of application Ser. No. 10/655,215, filed Sep. 5, 2003, the subject matter of each incorporated by reference herein.

FIELD OF INVENTION

The present invention relates generally to semiconductor memory devices and, more particularly to peak power reduction in content addressable memory (CAM) devices.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM). For example, data is stored in a RAM in a particular location, called an address. During a memory access, the user supplies an address and writes into or reads the data at the specified address.

In a CAM, however, data is stored in locations in a somewhat random fashion. The locations can be selected by an address bus, or the data can be written into the first empty memory location. Every memory location includes one or more status bits which maintain state information regarding the memory location. For example, each memory location may include a valid bit whose state indicate whether the memory location stores valid information, or whether the memory location does not contain valid information (and is therefore available for writing).

Once information is stored in a memory location, it is found by comparing every bit in a memory location with corresponding bits in a comparand register. When the content stored in the CAM memory location does not match the data in the comparand register, a local match detection circuit returns a no match indication. When the content stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which desired data is stored or identification of one of such addresses if more than one address contained matching data. Thus, with a CAM, the user supplies the data and gets back an address if there is a match found in memory.

Figure 1:
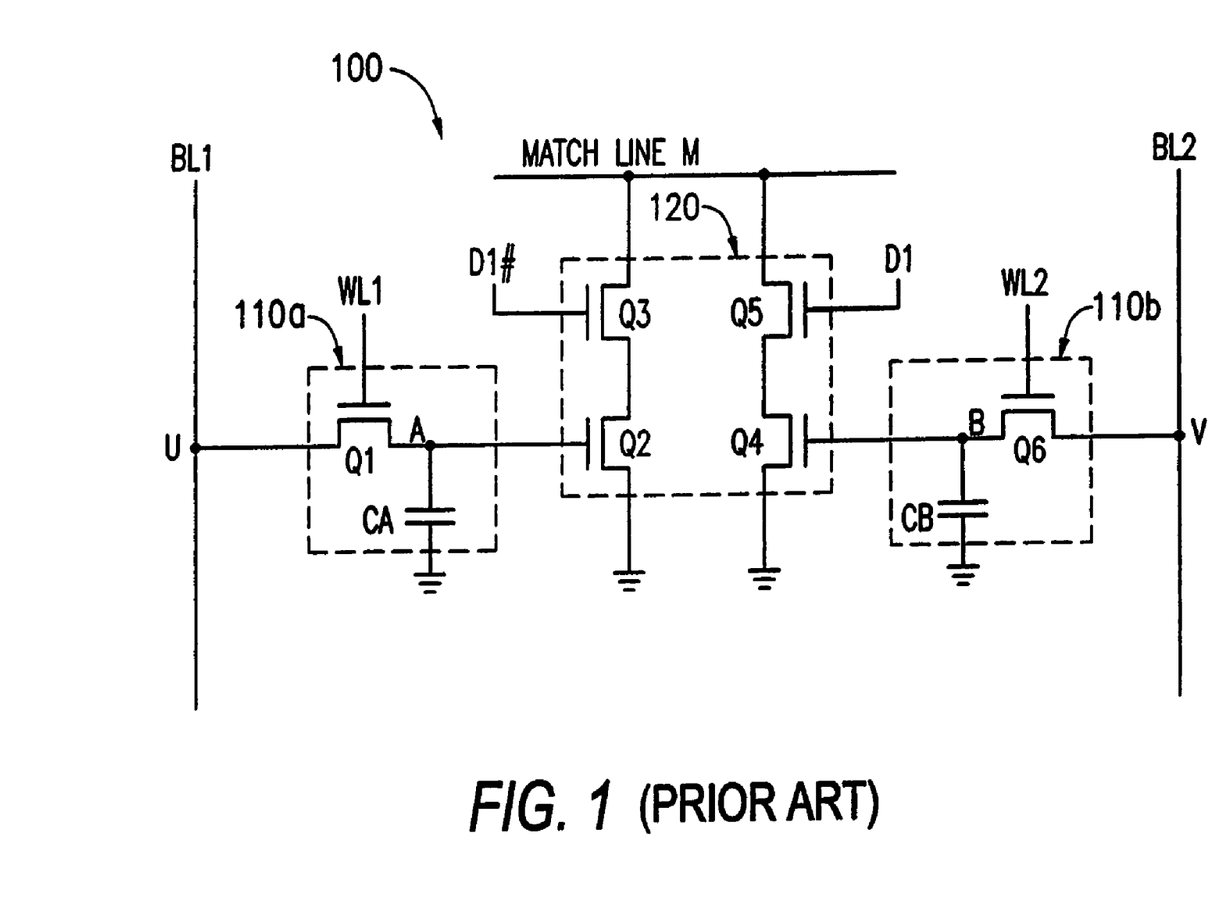
FIG. 1 is a circuit diagram of a conventional CAM cell.

FIG. 1 is a circuit diagram showing a conventional DRAM-based CAM cell 100, which includes two one-transistor (1T) DRAM cells 110a and 110b, and a four-transistor comparator circuit 120 made up of four transistors Q2, Q3, Q4, and Q5. Although FIG. 1 illustrates a DRAM-based CAM cell 100, it should be recognized that CAM devices can also be made using SRAM-based CAM cells. The DRAM cells 110a and 110b are used to store values. Generally, the content of the first cell 110a is the logical complement of the content of the second cell 110b. However, the cells 110a, 110b may also store the same values, i.e., "1"/"1", or "0"/"0", so that the CAM cell 100 is respectively set to "always match" or "always mismatch" states.

The first DRAM cell 110a includes transistor Q1 and capacitor CA, which combine to form a storage node A that receives a data value from a first bit line BL1 at node U during write operations, and applies the stored data value to the gate terminal of transistor Q2 of comparator circuit 120. Transistor Q2 is connected in series with transistor Q3 between a match line M and a ground potential. Transistor Q3 is controlled by a data signal transmitted on data line D1#. The second DRAM cell 110b includes transistor Q3 and capacitor CB, which combine to form a storage node B that receives a data value from a second bit line BL2 at node V, and applies the stored data value to the gate terminal of transistor Q4 of comparator circuit 120. Transistor Q4 is connected in series with transistor Q5 between the match line M and the ground potential. It should be noted that in some embodiments transistors Q2 and Q4 are coupled to a discharge line instead of being directly coupled to ground. Transistor Q5 is controlled by a data signal transmitted on data line D1, between the match line and the ground potential.

Figure 2:
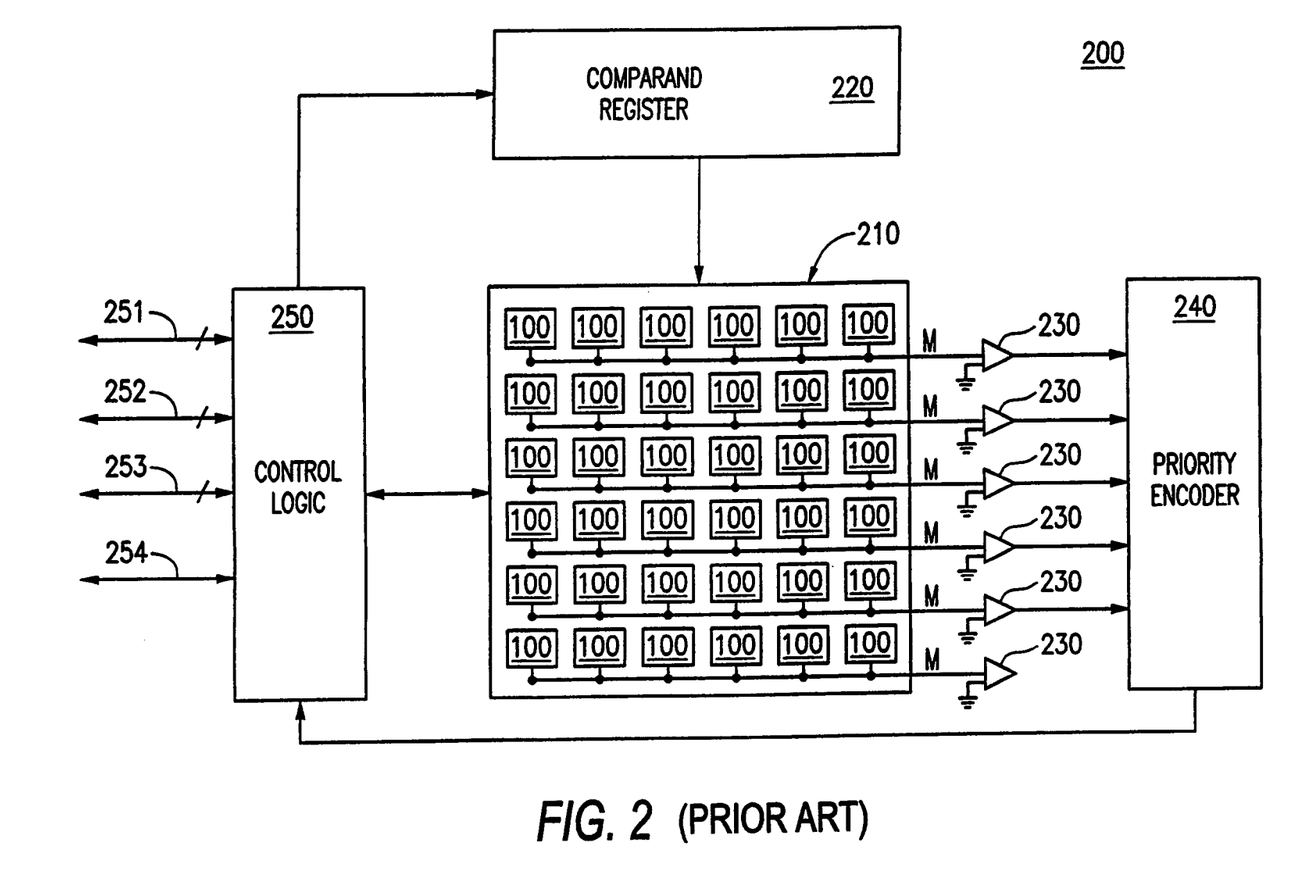
FIG. 2 is a block diagram of a conventional CAM device.

FIG. 2 is a block diagram of a conventional CAM device 200. The device 200 includes a CAM array 210 of cells 100 (FIG. 1). While the array 210 is illustrated as a single array, depending upon the number of cells 100, the array 210 may be replaced with a plurality of arrays. As illustrated, each row of cells 100 is coupled to a same match line M, which is also coupled, via a respective sense amplifier 230, to a priority encoder 240. The array 210 includes other well known components, such as bit lines, word lines, additional sense amplifiers, precharge circuits, refresh circuits, etc., which are not illustrated to simplify FIG. 2. The array 210 is also coupled to a comparand regiser 220, which is used to supply a search pattern to the array 210. The array 210, comparand register 220, and the priority encoder 240 are each coupled to control logic 250. The control logic 250, which is also coupled to data lines 251, address lines 252, control lines 253, and at least one clock line 254, controls the operation of the CAM device 200.

Now referring back to FIG. 1, when a match operation portion of the search is performed, data stored at nodes A and B of a cell 100 are respectively applied to the gate terminals of transistors Q2 and Q4 of comparator circuit 120. Comparator circuit 120 is utilized to perform match (comparison) operations after the match line M has been precharged by a precharge circuit (not illustrated). For example, when the match line M is precharged, an applied data value and its complement are transmitted on data lines D1 and D1# to the gate terminals of transistors Q3 and Q5, respectively. A no-match condition is detected when match line M is discharged to ground through the signal path formed by transistors Q2 and Q3, or through the signal path formed by transistors Q4 and Q5. For example, when the stored data value at node A and the applied data value transmitted on data line D1# are both logic "1", then both transistors Q2 and Q3 are turned on to discharge match line M to ground. This occurs because D1# should be the complement of the data at node A. When a match condition occurs, match line M remains in its precharged state (i.e., no signal path is formed by transistors Q2 and Q3, or transistors Q4 and Q5).

The above described match operation illustrates what happens in a single CAM cell 100. In the device 200, however, the match operation is performed simultaneously on all CAM cells 100. This permits search operations to be performed much faster on a CAM device than a conventional memory device, such as a DRAM. However, CAM devices 200 consume significantly more power and produce significantly more switching noise than a conventional memory device, especially during a first portion of the search operation because the CAM cells 100 are accessed and searched simultaneously. This results in the CAM device 200 having a peak power consumption which may be significantly higher than the average power consumption during a portion of each match operation. The high peak power consumption requires the CAM device 200 to be used with a robust power supply, and also increases heat production. Both of these effects are undesirable and should be minimized. Accordingly, there is a need for a CAM device architecture that has a lesser degree of peak power consumption.

SUMMARY OF THE INVENTION

The invention provides a CAM device architecture where the CAM cells are divided into at least two arrays. Each array is operated in a different clock domain so that each array is prevented from drawing maximum power at a same time. By dividing the CAM array into a plurality of arrays and staggering the search operation so that every array does not simultaneously draw maximum power, the peak power consumption of the CAM device is reduced.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 3A:
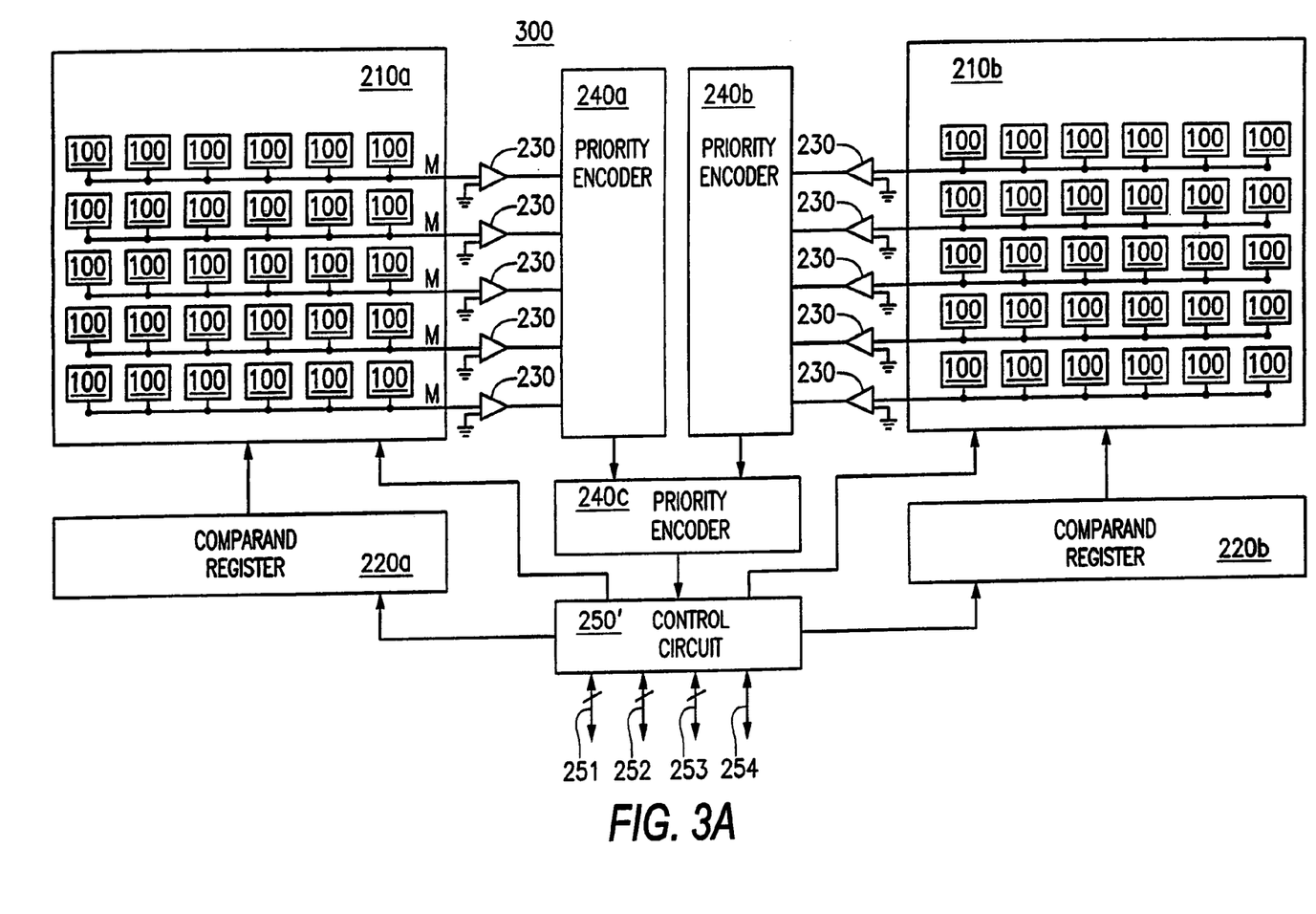
FIG. 3A is a block diagram illustrating a first exemplary embodiment of the invention.

Now referring to the drawings, where like reference numerals designate like elements, there is shown in FIG. 3A a block diagram of a CAM device 300 constructed in accordance with a first exemplary embodiment of the invention. The CAM cells 100 of device 300 are organized into two arrays 210*a*, 210*b*. As illustrated, the two arrays 210*a*, 210*b* respectively are oriented left and right of encoders 240*a*, 240*b*. However, it should be understood that the orientation of the two arrays 210*a*, 210*b* may be varied without departing from the scope of the invention. As illustrated, each array 210*a*, 210*b* is associated with a respective comparand register 220*a*, 220*b*. However, it should be understood that a single comparand register coupled to both arrays 210*a*, 210*b* may also be used without departing from the scope of the invention. Each row of CAM cells 100 is coupled to a respective match line M. Each match line M couples its row to a priority encoder 240*a*, 240*b* via a respective sense amplifier 230. The two priority encoders 240*a*, 240*b* operate to select the highest priority match from the respective arrays 210*a*, 210*b*. Each priority encoder 240*a*, 240*b* outputs an indication of the highest priority match to a third priority encoder 240*c*. The third priority encoder 240*c* selects the highest priority match indication from the outputs of the first and second priority encoders 240*a*, 240*b*. A new control circuit 250' is coupled to the comparand registers 220*a*, 220*b*, arrays 210*a*, 210*b*, and the priority encoders 240*a*, 240*b*, 240*c*.

Figure 3B:
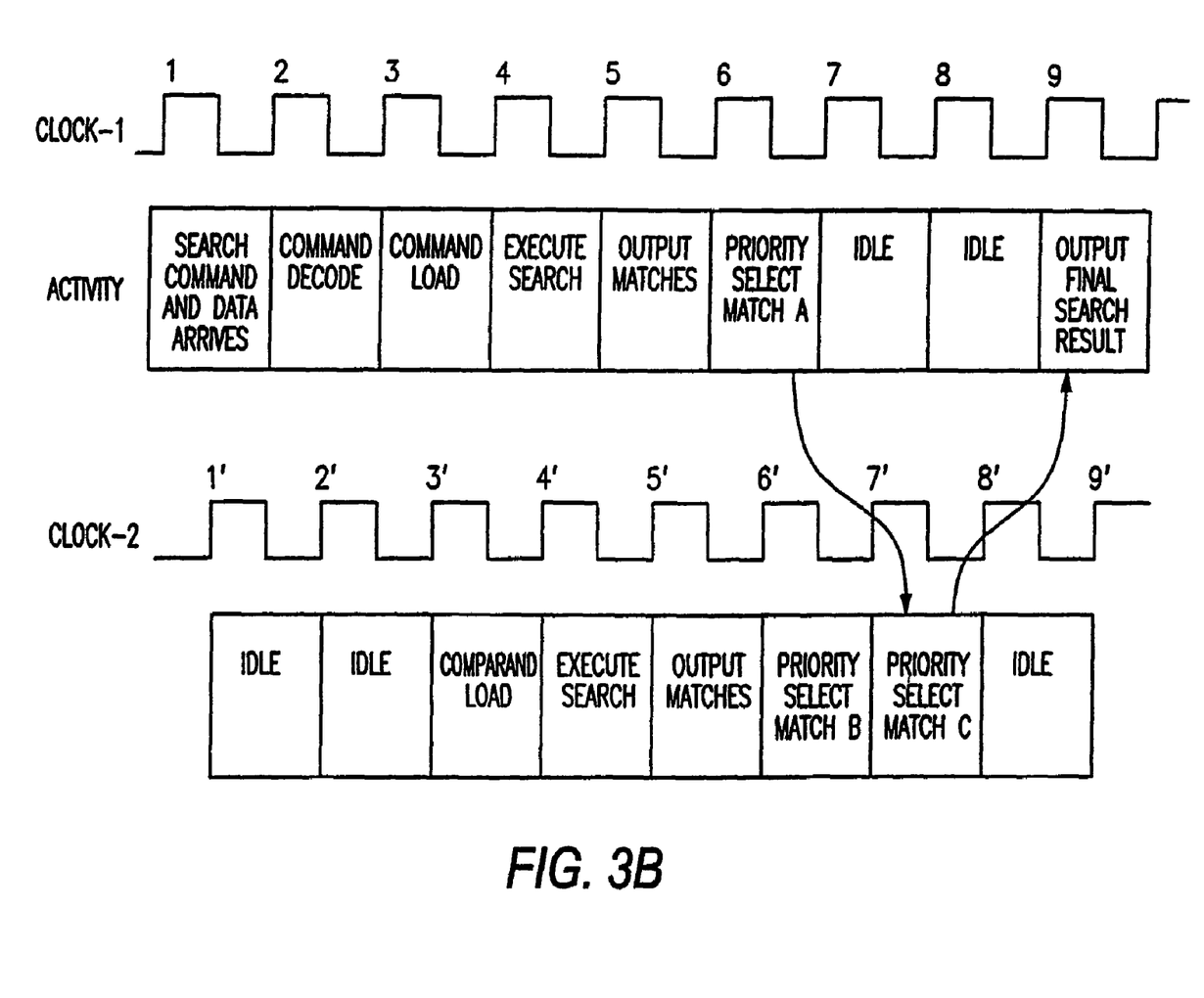
FIG. 3B is a timing diagram illustrating the operation sequence of the first embodiment of the invention.

In FIG. 3A, the control circuit 250' receives a clock signal on signal line 254 and generates two internal clock signals CLOCK-1, CLOCK-2 based on the received clock signal. Alternatively, this invention may also be implemented with the CLOCK-1 and CLOCK-2 signals as separate clock signals having the same relationship, but supplied to the device 300 from corresponding external clock sources. Now, also referring to FIG. 3B, it can be seen that in this exemplary embodiment, the two internal clock signals CLOCK-1, CLOCK-2 are arranged such that they are offset by a half cycle. More specifically, CLOCK-1 and CLOCK-2 have the same period as the received clock signal from line 254, however, CLOCK-2 is delayed by half a cycle. The CLOCK-1 clock signal is the timing signal associated with the left side of CAM device 300 (i.e., it is associated with array 210*a*), while the CLOCK-2 clock signal is the timing signal associated with the right side (i.e., it is associated with array 210*b*). In FIG. 3B the clock cycles for CLOCK-1 are labeled as 1, 2, 3, . . . 9, while the clock cycles for CLOCK-2 are labeled as 1', 2', 3', . . . , 9'. It should be noted that the time delay between CLOCK-1 and CLOCK-2 may be delayed by a different period without departing from the scope of the invention. More specifically, the delay between CLOCK-1 and CLOCK-2 must be sufficiently long to spread out the current draw over time. Additionally, the delay between CLOCK-1 and CLOCK-2 must also sufficiently short to prevent the circuitry govern by the CLOCK-2 signal from operating in a manner to overlap the operation of the next search operation govern by the circuitry governed by the CLOCK-1 signal. Thus, the delay between CLOCK-1 and CLOCK-2 can be plus or minus any fractional amount of a clock cycle.

Referring to both FIGS. 3A and 3B, the search operation in accordance with the first exemplary embodiment of the invention is now explained in chronological order:

In clock cycle 1, the search command and the search data arrives at the control circuit 250'. No activity is associated with clock cycle 1'. In clock cycle 2, the control circuit 250' decodes the search command. No activity is associated with clock cycle 2'. In clock cycle 3, the search data is loaded from the control circuit 250' to the left side comparand register 220a. In clock cycle 3', the search data is loaded fro the control circuit 250' to the right side comparand register 220b. In clock cycle 4, the left side array 210a executes a search.

In clock cycle 4', the right side array 210b executes a search. Thus, in the present embodiment, there is only a narrow overlap where both the right and left side arrays 220a, 220b are simultaneously in search mode. More specifically, in the present embodiment at no time are both arrays simultaneously drawing maximum power by being in the first portion of the search operation. Thus, peak power consumption in the device 300 by is reduced by avoiding a state where every CAM cell 100 is simultaneously drawing maximum power.

In clock cycle 5, the left side array 220a outputs its search hits (i.e., matches), if any, to priority encoder 240a. In clock cycle 5', the right side array 220b outputs its search hits, if any, to priority encoder 240b.

In clock cycle 6, the priority encoder 240a outputs its result to priority encoder 240c. In clock cycle 6', the priority encoder 240b outputs its result to priority encoder 240c. No task is associated with clock cycle 7. In clock cycle 7', the priority encoder 240c evaluates the input it received from priority encoders 240a, 240b. No task is associated with clock cycle 8. In clock cycle 8', the priority encoder 240c outputs its result to the control circuit 250'. In clock cycle 9, the control circuit 250' outputs the search result (off-chip). No activity is associated with clock cycle 9'.

The first embodiment of the invention therefore operates the device 300 over two clock domains. In one exemplary embodiment, the two clock domains are separated by a half cycle clock cycle, and each clock signal is respectively used to control a similar sequence of operations with respect to the two CAM arrays 210a, 210b. In this manner, the search operation, which in a conventional CAM device would have every CAM cell draw maximum power at the same time is converted into an overlapping operation where only half the CAM cells in the device at any given time is drawing maximum power. As a result, peak power consumption is reduced.

Figure 4A:
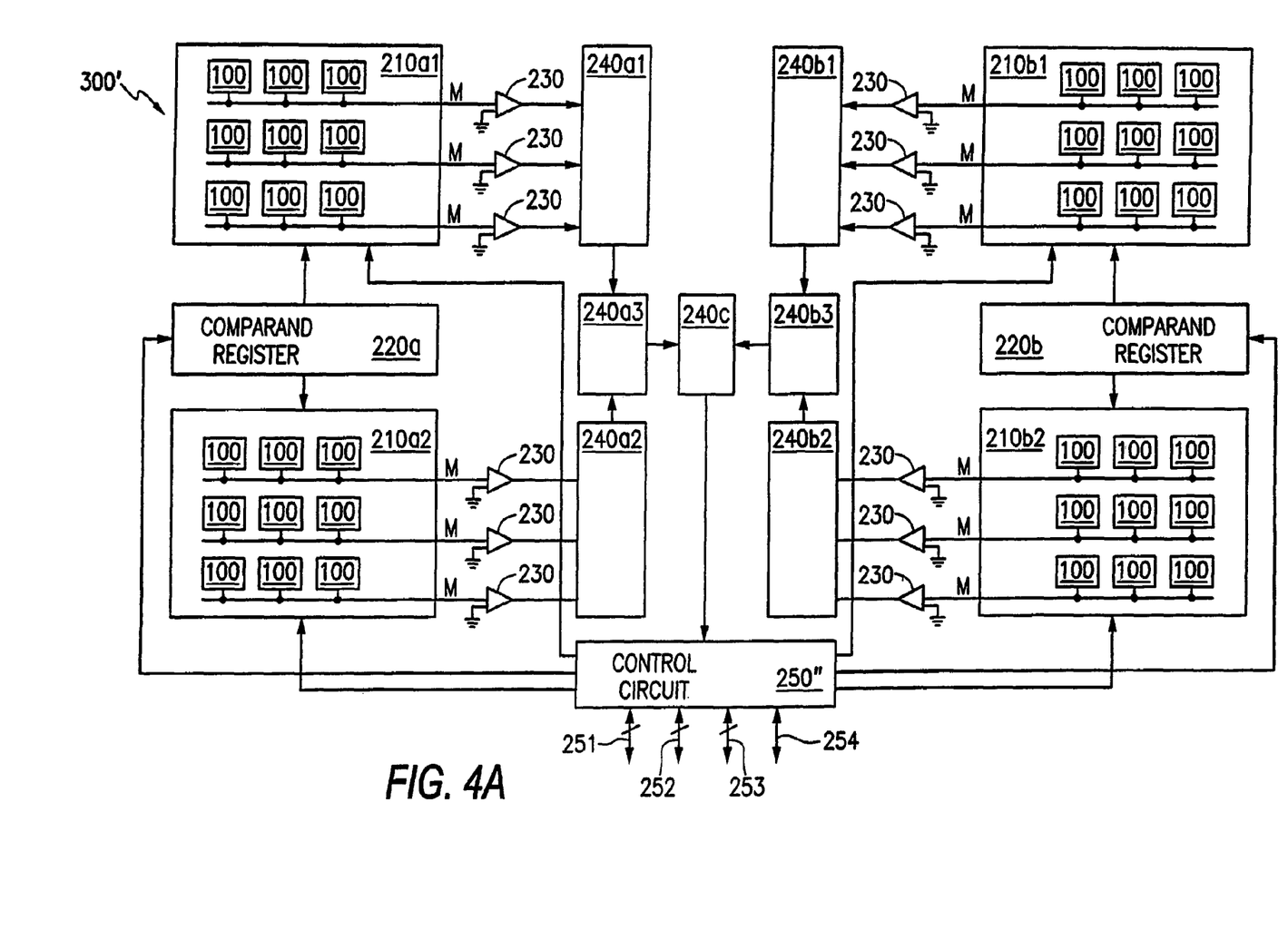
FIG. 4A is a block diagram illustrating a second exemplary embodiment of the invention.
Figure 4B:
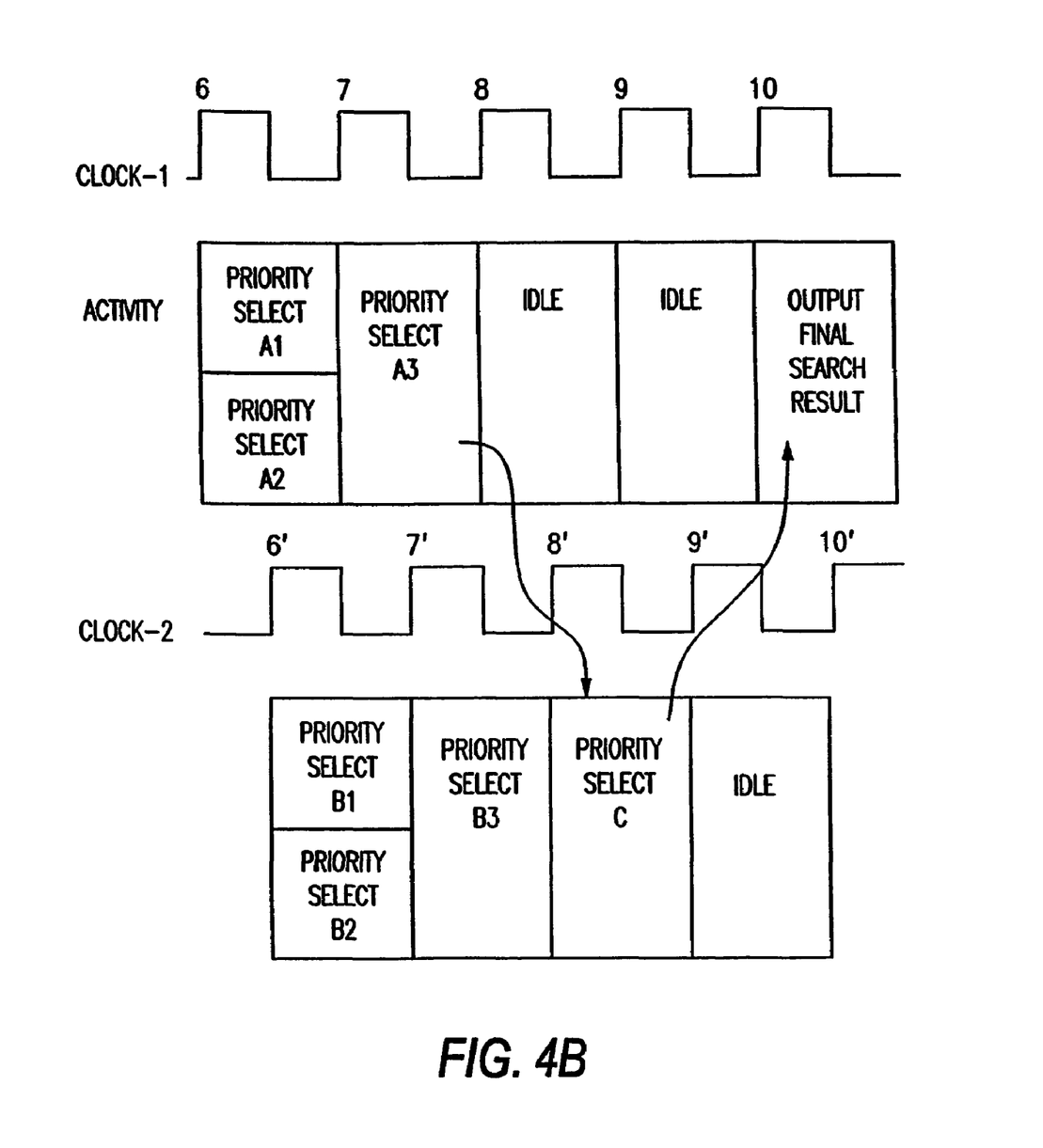
FIG. 4B is a timing diagram illustrating the operation sequence of the second embodiment of the invention.

Now referring to FIGS. 4A and 4B, a second exemplary embodiment of the invention is now explained. FIG. 4A illustrates a CAM device 300', which is similar to CAM device 300 of FIG. 3A. The primary difference is that the right and left arrays 210a, 210b (FIG. 3A) have been further subdivided into quadrants 210a1, 210a2, and 210b1, 210b2. Similarly, the number of priority encoders 240's has been increased, so that the top and bottom quadrants of 210a, 210b, respectively, are each serviced by their own priority encoders 240a1, 240a2, 240a3, 240b1, 240b2, 240b3.

The second exemplary embodiment behaves nearly identically to the first exemplary embodiment during an initial period of each search. More specifically, the two exemplary embodiment operate nearly identically during clock cycles 1–5 and 1'–5', since during these clock cycles the same operations are performed (i.e., receipt of search command, command decode, command load, execute search, and output matches). The only difference is that four quadrants are searched in the second embodiment while two arrays are searched in the first embodiment. It should be noted that each pair of quadrants (e.g., 210a1, 210a2) in the second embodiment which correspond to an array (e.g., 210a) of the first embodiment is operated in the same clock domain as the array of the first embodiment. That is, quadrants 210a1 and 210a2 are operated on a first clock domain while quadrants 210b1 and 210b2 are operated on a second clock domain. Thus, the second embodiment achieves a power reduction over that of a conventional four quadrant CAM device by ensure that no more than two quadrants operate at peak power simultaneously.

The second embodiment differs more from the first embodiment subsequent to clock cycles 5 and 5', due to the changes in the number of, and operation of, the priority encoders. As a result, the timing diagram of FIG. 4B omits cycles 1–5 and 1'–5' and spans only clock cycles 6–10 and 6'–10'. The processing which occurs during these cycles is now explained:

In clock cycle 6, priority encoders 240a1 and 240a2 each output their results to priority encoder 240a3. In clock cycle 6', priority encoders 240b1 and 240b2 output their results to priority encoder 240b3. In clock cycle 7, priority encoder 240a3 outputs its result to priority encoder 240c. In clock cycle 7', priority encoder 240b3 outputs its result to priority encoder 240c. No task is associated with clock cycle 8. In clock cycle 8', priority encoder 240c outputs it result to control circuit 250". In clock cycle 9, the control circuit 250" outputs the final result of the search process (off-chip). No task is associated with clock cycle 9'.

Figure 5:
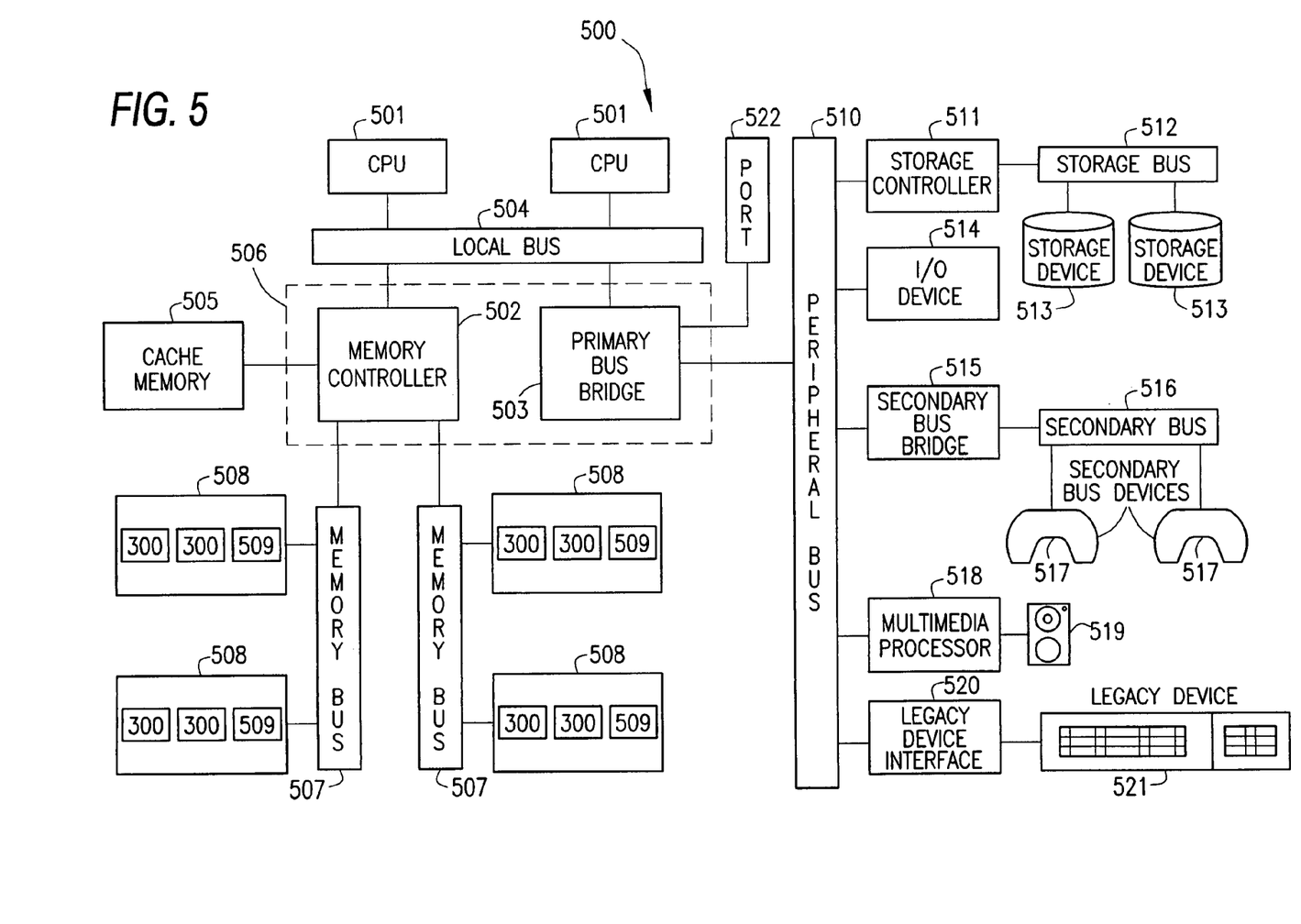
FIG. 5. is a block diagram of a processor based system having a CAM device constructed in accordance with the principles of the present invention.

FIG. 5 illustrates an exemplary processing system 500 which may utilize the memory device 300 (or 300') of the present invention. The processing system 500 includes one or more processors 501 coupled to a local bus 504. A memory controller 502 and a primary bus bridge 503 are also coupled the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus 507 accepts memory components 508 which include at least one memory device 300 (or 300') of the present invention. The memory components 508 may be a memory card or a memory module. Examples of memory modules include single inline memory modules (SIMMs) and dual inline memory modules (DIMMs). The memory components 508 may include one or more additional devices 509. For example, in a SIMM or DIMM, the additional device 509 might be a configuration memory, such as a serial presence detect (SPD) memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 include peripherals or controllers which are bus masters or which support direct memory access (DMA), the memory controller 502 may implement a cache coherency protocol. If the memory controller 502 is coupled to a plurality of memory buses 507, each memory bus 507 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515 communicating with a secondary bus 516, a multimedia processor 518, and a legacy device interface 520. The primary bus bridge 503 may also coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any sort of peripheral. For example, the I/O device 514 may be an local area network interface, such as an Ethernet card. The secondary bus bridge 515 may be used to interface additional devices via another bus 516 to the processing system. For example, the secondary bus bridge 515 may be an universal serial port (USB) controller used to couple USB devices 517 via to the processing system 500. The multimedia processor 518 may be a sound card, a video capture card, or any other type of media interface, which may also be coupled to additional devices such as speakers 519. The legacy device interface 520 is used to couple at least one legacy device 521, for example, older styled keyboards and mice, to the processing system 500.

The processing system 500 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 500 to become more suitable for use in a variety of applications. For example, many electronic devices which require processing may be implemented using a simpler architecture which relies on a CPU 501 coupled to memory components 508 and/or memory devices 300 (or 300'). These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Figure 6:
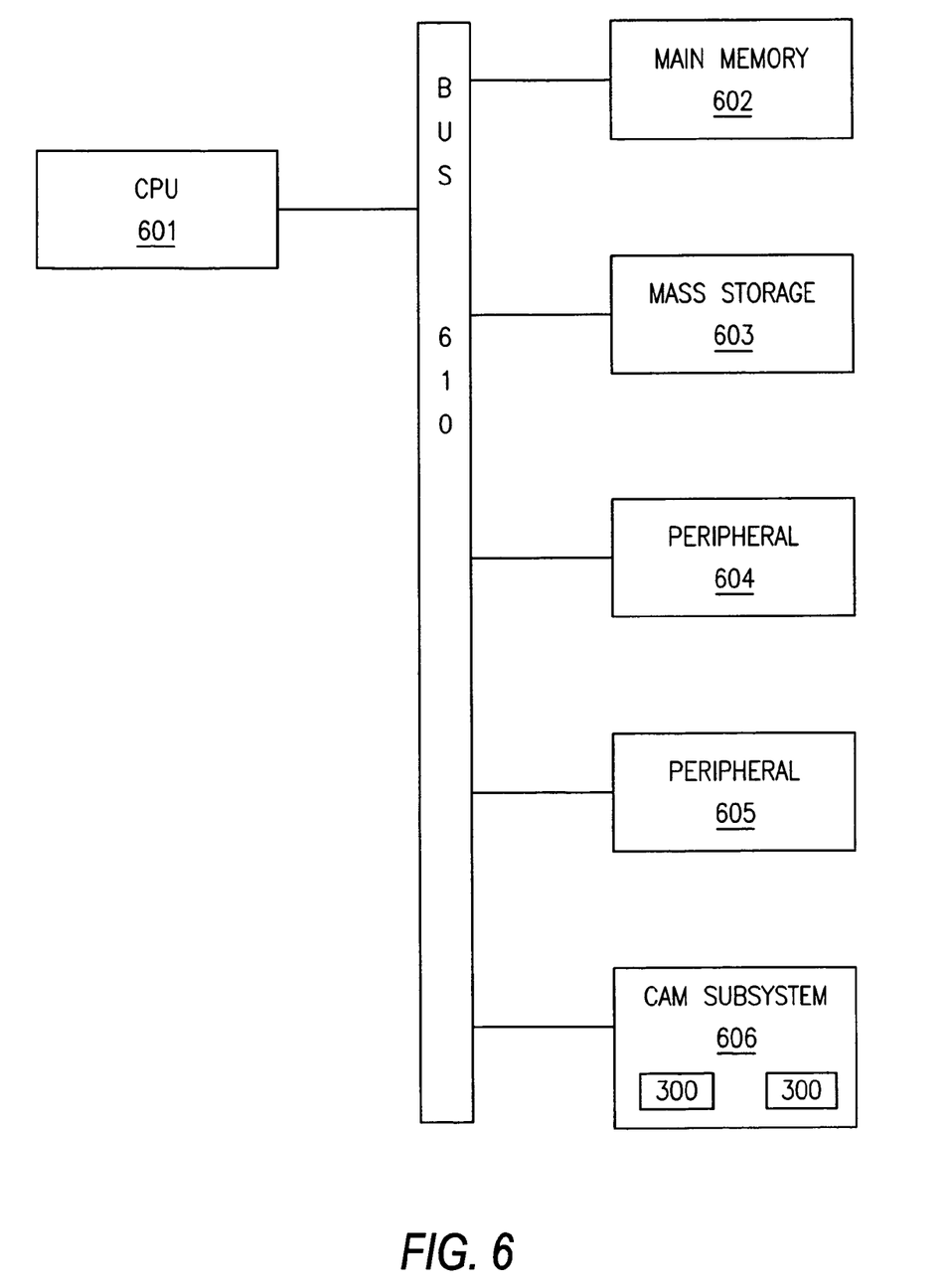
FIG. 6 is a block diagram of a router having a CAM device constructed in accordance with the principles of the present invention.

FIG. 6 is an illustration of an exemplary router 600 including a CAM device 300 (or 300') in accordance with the principles of the present invention. The router 600 includes a central processing unit (CPU) 601, a main memory 602, at least one mass storage device 603, at least two network interfaces 604–605, and a CAM subsystem 606, each coupled to at least one bus 610. The CAM subsystem 606 includes a plurality of CAM devices 300 of the present invention.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. For example, while the embodiment illustrated by FIGS. 4A and 4B discloses the use of two clocks CLOCK-1, CLOCK-2, each controlling a pair of quadrants, it should be recognized that the invention may be practiced using other configurations. For example, the invention may be practiced if each quadrant has its own clock, or even if three quadrants were controlled by CLOCK-1 while one quadrant is controlled by CLOCK-2. Similarly, the invention may also be implemented in a device having more than four quadrants. Accordingly, the invention is not limited by the foregoing description or drawings, but is only limited by the scope of the appended claims.

What is claimed as new and desired to be protected by Letters Patent of the United States is:

1. A content addressable memory (CAM) device, comprising:
    a plurality of CAM arrays, each comprising a plurality of CAM cells, at least a first one of said CAM arrays connected to a first clock signal and at least a second one of said CAM arrays connected to a second clock signal different from said first clock signal;
    a plurality of first priority encoders, each one of said first priority encoders being coupled to a respective one of said plurality of CAM arrays;
    at least one subsequent priority encoder coupled to said plurality of first priority encoders, said subsequent priority encoder receiving outputs from said plurality of first priority encoders and selecting one of said outputs; and
    a control circuit coupled to said plurality of CAM arrays, said plurality of first priority encoders, and said at least one subsequent priority encoder.

2. The device of claim 1, wherein said plurality of CAM arrays comprises first and second CAM arrays.

3. The device of claim 1, wherein said plurality of CAM array comprises first, second, third, and fourth CAM arrays.

4. The device of claim 3, wherein said first and second CAM arrays are associated with said first clock signal, and said third and fourth CAM arrays associated with said second clock signal.

5. The device of claim 4, wherein said at least one subsequent priority encoder comprises:
    a first subsequent priority encoder, coupled to said first and second CAM arrays;
    a second subsequent priority encoder, coupled to said third and fourth CAM arrays; and
    a third subsequent priority encoder coupled to outputs of said first and second subsequent priority encoder.

6. The device of claim 1, further comprising at least one comparand register, wherein each of said at least one comparand register is coupled to the control circuit.

7. A processor based system, comprising:
    a processor; and
    a memory subsystem, coupled to said processor, said memory subsystem further comprising at least one content addressable memory (CAM) device, wherein said at least one CAM device further comprises,
    a plurality of CAM arrays, each having a plurality of CAM cells, at least a first one of said CAM arrays connected to a first clock signal and at least a second one of said CAM arrays connected to a second clock signal different from said first clock signal;
    a plurality of first priority encoders, each one of said first priority encoders being coupled to a respective one of said plurality of CAM arrays;
    at least one subsequent priority encoder coupled to said plurality of first priority encoders, said subsequent priority encoder receiving outputs from said plurality of first priority encoders and selecting one of said outputs; and
    a control circuit coupled to said plurality of CAM arrays, said plurality of first priority encoders, and said at least one subsequent priority encoder.

8. The system of claim 7, wherein said plurality of CAM arrays comprises first and second CAM arrays.

9. The system of claim 7, wherein said plurality of CAM array comprises first, second, third, and fourth CAM arrays.

10. The system of claim 9, wherein said first and second CAM arrays are operated in accordance with the first clock signal and said third and fourth CAM arrays are operated in accordance with the second clock signal.

11. The system of claim 10, wherein said at least one subsequent priority encoder comprises:
- a first subsequent priority encoder, coupled to said first and second CAM arrays;
- a second subsequent priority encoder, coupled to said third and fourth CAM arrays; and
- a third subsequent priority encoder coupled to outputs of said first and second subsequent priority encoder.

12. The system of claim 10, wherein a first clock domain and a second clock domain correspond to respective said and first and second clock signals which are supplied to said device.

13. The system of claim 12, wherein said second clock domain is offset from said first clock domain by any fractional clock cycle.

14. The system of claim 13, wherein said second clock domain is delayed by one half clock cycle from said first clock domain.

15. The system of claim 7, further comprising at least one comparand register, wherein each of said at least one comparand register is coupled to the control circuit.

16. A router, comprising:
- a processor;
- a first network interface, coupled to said processor;
- a second network interface, coupled to said processor; and
- a memory subsystem, coupled to said processor, said memory subsystem comprising at least one content addressable memory (CAM) device, wherein said at least one CAM device comprises:
- a plurality of CAM arrays, each having a plurality of CAM cells, at least a first one of said CAM arrays connected to a first clock signal and at least a second one of said CAM arrays connected to a second clock signal different from said first clock signal;
- a plurality of first priority encoders, each one of said first priority encoders being coupled to a respective one of said plurality of CAM arrays;
- at least one subsequent priority encoder coupled to said plurality of first priority encoders, said subsequent priority encoder receiving outputs from said plurality of first priority encoders and selecting one of said outputs; and
- a control circuit coupled to said plurality of CAM arrays, said plurality of first priority encoders, and said at least one subsequent priority encoder.

* * * * *

UNITED STATES PATENT AND TRADEMARK OFFICE
CERTIFICATE OF CORRECTION

PATENT NO. : 7,139,182 B2
APPLICATION NO. : 11/033987
DATED : November 21, 2006
INVENTOR(S) : William Radke It is certified that error appears in the above-identified patent and that said Letters Patent is hereby corrected as shown below:

Column 1, line 50, "indicate" should read --indicates--.

Column 4:

Line 56, "also sufficiently" should read --also be sufficiently--; and

Line 57, "govern" should read --governed--.

Column 5:

Line 5, "fro" should read --from--; and

Line 56, "embodiment" should read --embodiments--.

Column 6:

Line 5, "by" should read --to--;

Line 6, "ensure" should read --ensuring--;

Line 22, "it" should read --its--;

Line 31, "coupled the" should read --coupled to the--; and

Line 52, "include" should read --includes--.

Column 7:

Line 10, "an local" should read --a local--;

Line 14, "an universal" should read --universal--; and

Line 36, "system" should read --systems--.

Column 9, line 2, "array" should read --arrays--.

UNITED STATES PATENT AND TRADEMARK OFFICE
CERTIFICATE OF CORRECTION

| | | |
|---|---|---|
| PATENT NO. | : 7,139,182 B2 | |
| APPLICATION NO. | : 11/033987 | |
| DATED | : November 21, 2006 | |
| INVENTOR(S) | : William Radke | |

It is certified that error appears in the above-identified patent and that said Letters Patent is hereby corrected as shown below:

Column 9, line 16, "said and" should read --said--.

Signed and Sealed this

Twenty-seventh Day of February, 2007

JON W. DUDAS
*Director of the United States Patent and Trademark Office*